(12) United States Patent
Hsu

(10) Patent No.: US 8,115,568 B2
(45) Date of Patent: Feb. 14, 2012

(54) LAYOUT OF A CIRCUIT BOARD WITH STACKED SIGNAL AND REFERENCE LAYERS AND AN OPENING IN THE REFERENCE LAYER

(75) Inventor: Ti-Ming Hsu, Taipei (TW)

(73) Assignee: Compal Electronics, Inc., Taipei (TW)

( * ) Notice: Subject to any disclaimer, the term of this patent is extended or adjusted under 35 U.S.C. 154(b) by 191 days.

(21) Appl. No.: 12/190,597

(22) Filed: Aug. 13, 2008

(65) Prior Publication Data
US 2009/0079523 A1   Mar. 26, 2009

(30) Foreign Application Priority Data

Sep. 20, 2007   (TW) .............................. 96135143 A

(51) Int. Cl.
*H01P 3/08* (2006.01)

(52) U.S. Cl. ............................. 333/33; 333/238; 333/4

(58) Field of Classification Search .................. 333/1, 4, 333/33, 238, 246
See application file for complete search history.

(56) References Cited

U.S. PATENT DOCUMENTS

| 6,624,729 | B2 * | 9/2003 | Wright et al. | 333/238 |
| 6,765,450 | B2 * | 7/2004 | Howard et al. | 333/4 |
| 7,397,320 | B1 * | 7/2008 | Bokhari | 333/1 |
| 2005/0083152 | A1 * | 4/2005 | Hsu et al. | 333/238 |
| 2006/0071739 | A1 * | 4/2006 | Hsu | 333/238 |

FOREIGN PATENT DOCUMENTS

TW   468363   12/2001

* cited by examiner

*Primary Examiner* — Benny Lee
(74) *Attorney, Agent, or Firm* — Jianq Chyun IP Office

(57) ABSTRACT

A layout of a circuit board includes a first signal layer, a second signal layer, and a third signal layer. The first signal layer has a transmission line. The second signal layer is stacked below the first signal layer, and has an opening. The third signal layer is stacked below the first and second signal layers with the second signal layer sandwiched between the first and third signal layers. The third signal layer is electrically connected to the second signal layer, and both of the second and third signal layers are ground layers or power layers. An orthogonal projection of a segment of the transmission line on the third signal layer is overlapped with that of the opening on the third signal layer. Therefore, an equivalent impedance of the segment of the transmission line with respect to the second and third signal layers can be increased or decreased.

6 Claims, 5 Drawing Sheets

LAYOUT OF A CIRCUIT BOARD WITH STACKED SIGNAL AND REFERENCE LAYERS AND AN OPENING IN THE REFERENCE LAYER

CROSS-REFERENCE TO RELATED APPLICATION

This application claims the priority benefit of Taiwan application serial no. 96135143, filed on Sep. 20, 2007. The entirety of the above-mentioned patent application is hereby incorporated by reference herein and made a part of this specification.

BACKGROUND OF THE INVENTION

1. Field of the Invention

The present invention generally relates to a layout of a circuit board, in particular, to a layout of a circuit board capable of changing impedance values at both ends of one transmission line.

2. Description of Related Art

Circuit boards have been widely applied in various electronic devices. Many different electronic components are mounted on a circuit board, and are electrically connected to each other through the layout of the circuit board. Moreover, the heat generated by the electronic components is partially dissipated by metal portions of the circuit boards. In actual application, the mainboard of a notebook computer is an application of the circuit board with various electronic components mounted thereon.

In order to adjust an equivalent impedance at both ends of a segment of a transmission line in the circuit board with respect to a ground layer or power layer located beside the transmission line to a particular value. Conventionally, the line thickness, line width, or line pitch of the segment of the transmission line, or the distance between the segment of the transmission line and the adjacent reference plane thereof may be changed to achieve the purpose of adjusting the equivalent impedance at both ends of the segment of the transmission line.

However, in order to increase the equivalent impedance of the segment of the transmission line with respect to a ground layer or power layer, the line thickness, line width, or line pitch of the segment of the transmission line in the circuit board cannot be reduced under the limitations of the process accuracy and the process yield. Moreover, restricted by the thickness of the circuit board, the distance between the segment of the transmission line and the adjacent reference plane thereof cannot be increased. Therefore, the current layout of a circuit board is limited in design.

SUMMARY OF THE INVENTION

Accordingly, the present invention is directed to a layout of a circuit board, which is capable of increasing an equivalent impedance of a segment of a transmission line with respect to a ground layer or power layer.

The present invention provides a layout of a circuit board, which includes a signal layer, a first reference layer, and a second reference layer. The signal layer has a transmission line. The first reference layer is stacked below the signal layer, and has an opening. The second reference layer is stacked below the signal layer and the first reference layer with the first reference layer sandwiched between the signal layer and the second reference layer. The second reference layer is electrically connected to the first reference layer, and both of the first and second reference layers are ground layers or power layers. An orthogonal projection of a segment of the transmission line on the second reference layer is overlapped with an orthogonal projection of the opening on the second reference layer.

In an embodiment of the present invention, a width of the orthogonal projection of the segment of the transmission line on the second reference layer is smaller than a width of the orthogonal projection of the opening on the second reference layer.

In an embodiment of the present invention, the signal layer further includes another transmission line, forming a differential pair with the above transmission line. An orthogonal projection of a section of the differential pair on the second reference layer is overlapped with an orthogonal projection of the opening on the second reference layer. Moreover, a width of the orthogonal projection of the section of the differential pair on the second reference layer is smaller than a width of the orthogonal projection of the opening on the second reference layer.

In an embodiment of the present invention, an equivalent impedance of the segment of the transmission line providing the orthogonal projection is greater than an equivalent impedance of any other segment of the transmission line.

The present invention further provides a layout of a circuit board, which includes a first signal layer, a reference layer, a second signal layer, and a ground line. The first signal layer has a transmission line. The reference layer is stacked below the first signal layer, and has an opening. The second signal layer is stacked below the first signal layer and the reference layer with the reference layer sandwiched between the first and second signal layers. The reference line is set on the same level as the second signal layer, and electrically connected to the reference layer. In addition, an orthogonal projection of a segment of the transmission line on the reference line is overlapped with an orthogonal projection of the opening on the reference line.

In an embodiment of the present invention, a width of the orthogonal projection of the segment of the transmission line on the reference line is smaller than a width of the orthogonal projection of the opening on the reference line.

In an embodiment of the present invention, an equivalent impedance of the segment of the transmission line providing the orthogonal projection is greater than an equivalent impedance of any other segment of the transmission line.

In the present invention, an opening is formed in the first reference layer to increase the distance between the segment of the transmission line and the second reference layer (i.e., a ground layer or power layer), so as to increase an equivalent impedance of the segment of the transmission line with respect to the first and second reference layers, thereby meeting the requirement in the design of the circuit board. Further, in the present invention, an opening is formed in the reference layer and a reference line is set on the same level as the second signal layer, so as to increase an equivalent impedance of the segment of the transmission line with respect to the reference layer and the reference line, so as to meet the requirement in the design of the circuit board. In addition, the present invention may also be applied to a circuit board having a differential pair.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE EMBODIMENTS

Figure 1A:
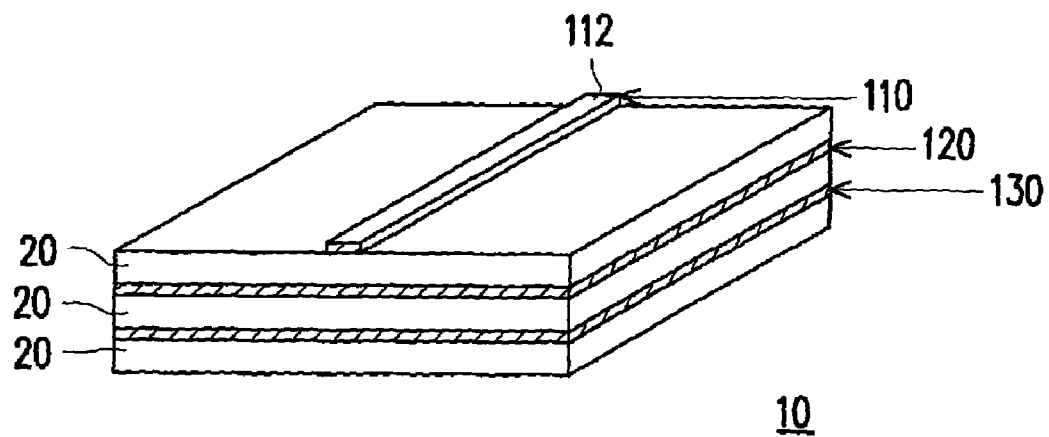
FIG. 1A illustrates a layout of a circuit board according to an embodiment of the present invention.

Reference will now be made in detail to the present embodiments of the invention, examples of which are illustrated in the accompanying drawings. Wherever possible, the same reference numbers are used in the drawings and the description to refer to the same or like parts, which may not be described in detail in each drawing figure in which they appear.

In the following two embodiments, the same symbols represent identical or similar components.

Figure 1B:
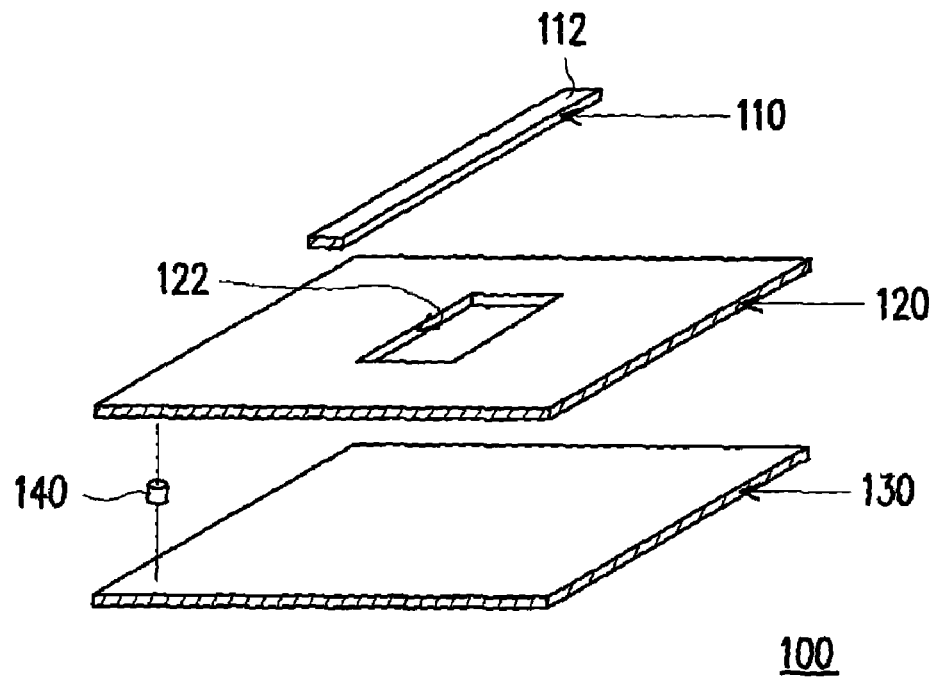
FIG. 1B is an exploded view of the layout in FIG. 1A.
Figure 1C:
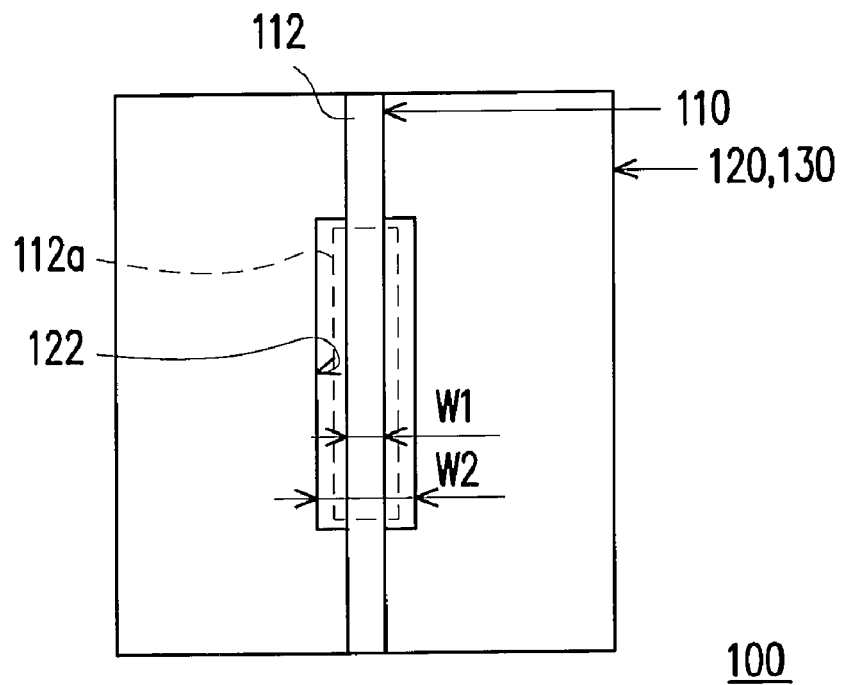
FIG. 1C is a top view of the layout in FIG. 1B.

FIG. 1A illustrates a layout of a circuit board according to an embodiment of the present invention, FIG. 1B is an exploded view of the layout in FIG. 1A, and FIG. 1C is a top view of the layout in FIG. 1B. Referring to FIGS. 1A to 1C, the circuit board 10 (FIG. 1A) of this embodiment has a layout 100. The layout 100 (FIGS. 1B and 1C) includes a signal layer 110, a first reference layer 120, and a second reference layer 130 stacked in sequence with the first reference layer 120 sandwiched between the signal layer 110 and the second reference layer 130. Further, the circuit board 10 includes a plurality of dielectric layers 20 (FIG. 1A) respectively located between the layers 110, 120, 130, for electrically insulating the layers 110, 120, 130, as shown in FIG. 1A.

The signal layer 110 has a transmission line 112, and the first reference layer 120 is a ground layer. In order to increase an equivalent impedance of a segment 112a (FIG. 1C) of the transmission line 112 with respect to the first reference layer 120, an opening 122 (FIGS. 1B and 1C) is formed in the first reference layer 120, and the second reference layer 130 is electrically connected to the first reference layer 120. In this embodiment, the second reference layer 130 is electrically connected to the first reference layer 120 through a plurality of conductive vias 140 (only one conductive via 140 is shown in FIG. 1B).

The second reference layer 130 and the first reference layer 120 are ground layers or power layers to be reference planes for the segment 112a of the transmission line 112.

An orthogonal projection of the segment 112a of the transmission line 112 on the second reference layer 130 is overlapped with an orthogonal projection of the opening 122 on the second reference layer 130. In other words, an orthogonal projection of the segment 112a of the transmission line 112 on the first reference layer 120 is overlapped with the opening 122. In this embodiment, a width W1 of the orthogonal projection of the segment 112a of the transmission line 112 on the second reference layer 130 is smaller than a width W2 of the orthogonal projection of the opening 122 on the second reference layer 130 as shown in FIG. 1C.

The opening 122 is formed in the first reference layer 120 to increase the distance between the segment 112a of the transmission line 112 and the second reference layer 130, such that an equivalent impedance of the segment 112a of the transmission line 112 with respect to the first reference layer 120 and the second reference layer 130 is greater than an equivalent impedance of any other segment of the transmission line 112 with respect to the first reference layer 120. Therefore, an equivalent impedance of any segment obtained from the transmission line 112 may be adjusted, so as to meet the requirement on the design of the circuit board 10.

Figure 1D:
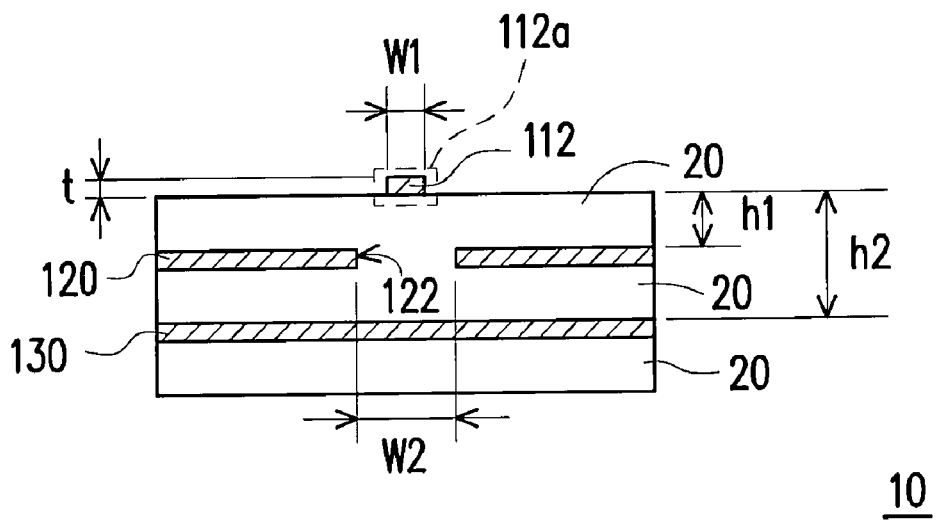
FIG. 1D is a cross-sectional view of the circuit board in FIG. 1A.

FIG. 1D is a cross-sectional view of the circuit board in FIG. 1A. Referring to FIGS. 1C and 1D, the opening 122 is formed to increase the distance between the segment 112a of the transmission line 112 and a ground layer (power layer), and the segment 112a of the transmission line 112 takes the second reference layer 130 (also a ground layer) as reference. In this embodiment, the equivalent impedance is obtained by the following formula:

$$Zo = \frac{87}{\sqrt{Er + 1.41}} \ln \frac{5.98h}{0.87w + t}$$

In the above formula, Zo is the equivalent impedance, Er is the relative dielectric constant, h is the distance between a transmission line and a ground layer, w is the width of the transmission line, and t is the thickness of the transmission line. The dielectric layer 20 is made of an epoxy glass with a relative dielectric constant of 4.8 to 5.0. When the width w and thickness t (FIG. 1D) are fixed, the distance h is in direct proportion to the equivalent impedance Zo.

When the opening 122 is not formed, the segment 112a of the transmission line 112 takes the first reference layer 120 (a ground layer/power layer) as a reference plane. As shown in FIG. 1D, the distance between the segment 112a of the transmission line 112 and the first reference layer 120 is h1. However, when the opening 122 is formed, the segment 112a of the transmission line 112 takes the second reference layer 130 (a ground layer/power layer) as a reference plane. The distance between the segment 112a of the transmission line 112 and the second reference layer 130 is h2.

Thus, through the opening 122 in this embodiment, the distance h2 between the segment 112a of the transmission line 112 and the second reference layer 130 is greater than the distance h1 between any other segment of the transmission line 112 and the first reference layer 120, such that the equivalent impedance of the segment 112a of the transmission line 112 is greater than the equivalent impedance of any other segment of the transmission line 112.

Figure 1E:
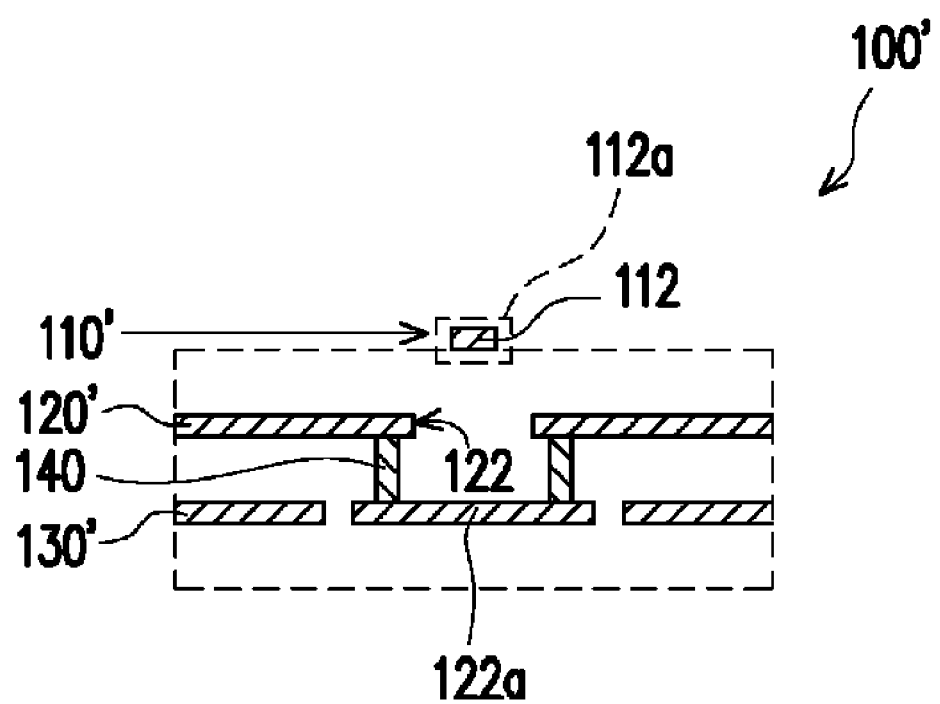
FIG. 1E is a cross-sectional view of a layout of a circuit board according to still another embodiment of the present invention.

FIG. 1E is a cross-sectional view of a layout of a circuit board according to another embodiment of the present invention. Referring to FIG. 1E, compared with the layout 100 in FIG. 1C, the layout 100' of a circuit board of this embodiment further includes a reference line 122a. The reference line 122a is set on the same level as the second signal layer 130', and is electrically connected to the reference layer 120' through at least one conductive via 140. An orthogonal projection of a segment 112a of the first transmission line 112 in the first signal layer 110' on the reference line 122a is overlapped with an orthogonal projection of the opening 122 in the reference layer 120 on the reference line 122a. Likewise, the equivalent impedance of the segment 112a of the transmission line 112 is greater than the equivalent impedance of any other segment of the transmission line 112. In this embodiment, a width of the orthogonal projection of the segment 112a of the transmission line 112 on the reference line 122a is smaller than a width of the orthogonal projection of the opening 122 on the reference line 122a, and the second signal layer 130' is a signal layer for signal transmission.

Figure 2A:
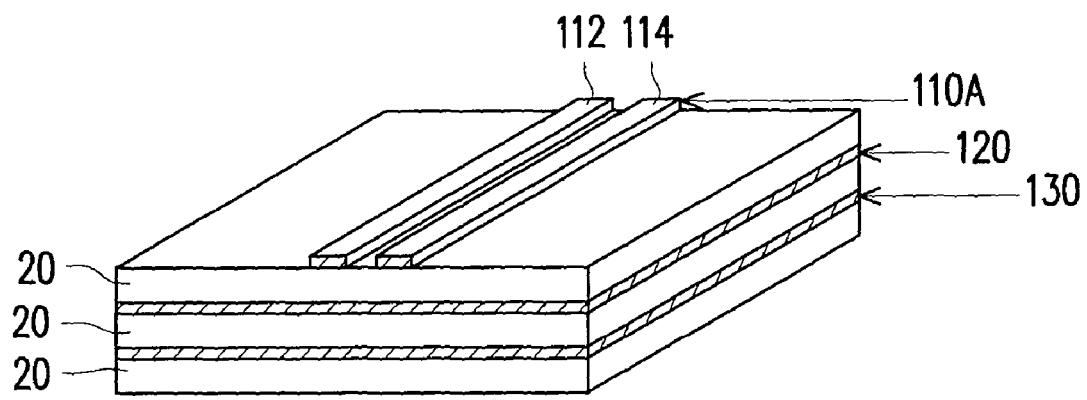
FIG. 2A illustrates a layout of a circuit board according to another embodiment of the present invention.
Figure 2B:
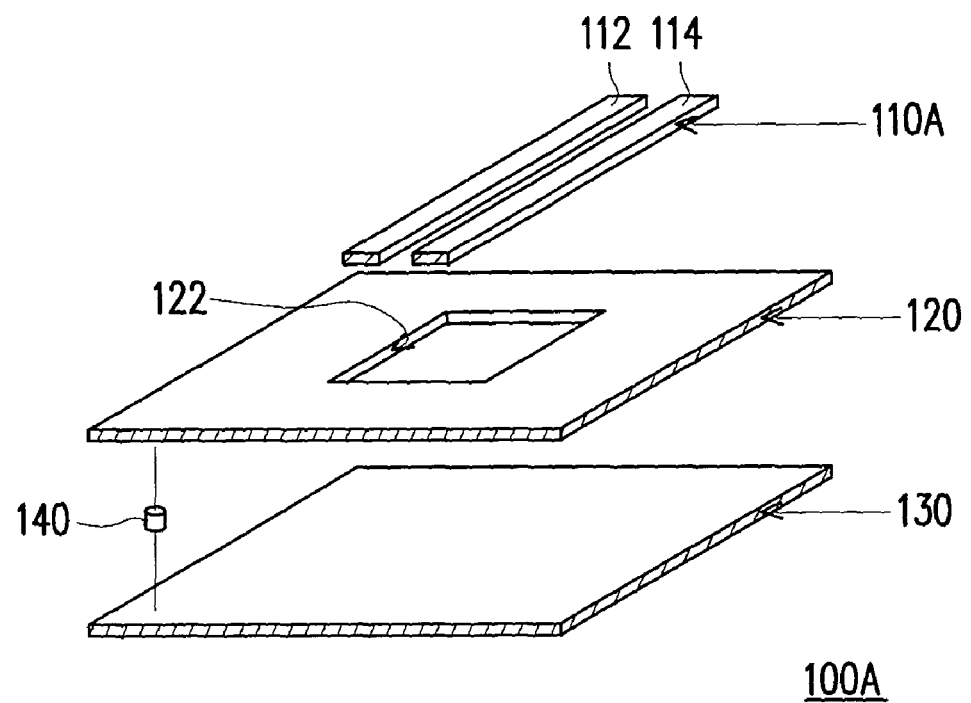
FIG. 2B is an exploded view of the layout in FIG. 2A.
Figure 2C:
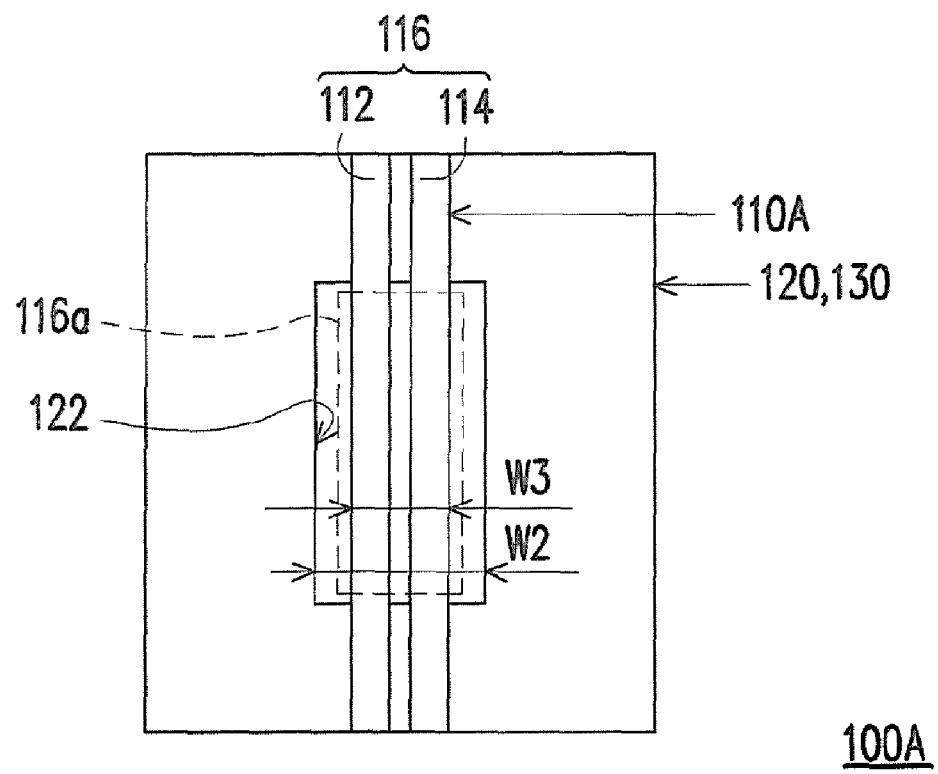
FIG. 2C is a top view of the layout in FIG. 2B.

FIG. 2A illustrates a layout of a circuit board according to another embodiment of the present invention, FIG. 2B is an exploded view of the layout in FIG. 2A, and FIG. 2C is a top view of the layout in FIG. 2B. Referring to FIGS. 2A to 2C, the circuit board 10A (FIG. 2A) of this embodiment has a layout 100A (FIGS. 2B and 2C). The layout 100A includes a signal layer 110A, a first reference layer 120, and a second reference layer 130 stacked in sequence with the first reference layer 120 sandwiched between the signal layer 110A and the second reference layer 130. Moreover, the circuit board 10A further includes a plurality of dielectric layers 20 respectively sandwiched between the layers 110A, 120, 130, for electrically insulating the layers 110A, 120, 130, as shown in FIG. 2A.

In this embodiment, the signal layer 110A has transmission lines 112, 114 forming a differential pair 116 (FIG. 6C). In addition, the first reference layer 120 is a ground layer or power layer. In order to increase a total equivalent impedance of a section 116a (FIG. 6C) of the differential pair 116 with respect to the first reference layer 120, an opening 122 (FIGS. 2B and 2C) is formed in the first reference layer 120, and the second reference layer 130 is electrically connected to the first reference layer 120. In this embodiment, the second reference layer 130 is electrically connected to the first reference layer 120 through a plurality of conductive vias 140 (only one conductive via 140 is shown in FIG. 2B).

In this embodiment, the second reference layer 130 and the first reference layer 120 are ground layers or power layers to be reference planes for the section 116a of the differential pair 116.

An orthogonal projection of the section 116a of the differential pair 116 on the second reference layer 130 is overlapped with an orthogonal projection of the opening 122 on the second reference layer 130. In other words, an orthogonal projection of the section 116a of the differential pair 116 on the first reference layer 120 is overlapped with the opening 122. In this embodiment, a width W3 of the orthogonal projection of the section 116a of the differential pair 116 on the second reference layer 130 as shown in FIG. 2C is smaller than a width W2 of the orthogonal projection of the opening 122 on the second reference layer 130.

The opening 122 is formed in the first reference layer 120 to increase the distance between the section 116a of the differential pair 116 and the second reference layer 130, such that the equivalent impedance of the section 116a of the differential pair 116 with respect to the first reference layer 120 and the second reference layer 130 is greater than the equivalent impedance of any other section of the differential pair 116 with respect to the first reference layer 120. Therefore, the equivalent impedance of any section of the differential pair 116 formed by the transmission lines 112, 114 may be adjusted, so as to meet the requirement on the design of the circuit board 10A.

In view of the above, according to the present invention, an opening is formed in the first reference layer (a ground layer/power layer) at a position right below the segment of the transmission line in the signal layer, for increasing the distance between the segment of the transmission line and the ground layer (power layer), such that the equivalent impedance of the segment of the transmission line with respect to the first reference layer and the second reference layer (a ground layer/power layer) which is electrically connected to the first reference layer and located below the first reference layer is increased.

Further, in the present invention, an opening is formed in the reference layer (a ground layer/power layer) at a position right below the segment of the transmission line in the first signal layer, and a reference line is disposed below the reference layer and electrically connected to the reference layer, for increasing the distance between the segment of the transmission line and the ground layer (power layer), such that the equivalent impedance of the segment of the transmission line with respect to the reference layer and the reference line located below the reference layer is increased.

In addition, the present invention is also applicable to a circuit board having a differential pair, so as to increase the equivalent impedance of a certain section of the differential pair referring to a ground layer/power layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A layout of a circuit board, comprising:
a first signal layer, comprising a transmission line;
a reference layer, stacked below the first signal layer, and comprising an opening; and
a second signal layer, stacked below the first signal layer and the reference layer with the reference layer sandwiched between the first and second signal layers, wherein the second signal layer further includes a reference line, set on the same level as the second signal layer, and being electrically and directly connected to the reference layer, and an orthogonal projection of a segment of the transmission line on the reference line is overlapped with an orthogonal projection of the opening on the reference line.

2. The layout of a circuit board according to claim 1, wherein a width of the orthogonal projection of the segment of the transmission line on the reference line is smaller than a width of the orthogonal projection of the opening on the reference line.

3. The layout of a circuit board according to claim 1, wherein an equivalent impedance of the segment of the transmission line is greater than an equivalent impedance of any other segment of the transmission line.

4. The layout of a circuit board according to claim 1, wherein the reference line is connected to the reference layer through a conductive via.

5. The layout of a circuit board according to claim 1, wherein the reference layer is a ground layer.

6. The layout of a circuit board according to claim 1, wherein the reference layer is a power layer.

* * * * *